United States Patent
Adam et al.

(10) Patent No.: US 9,362,309 B2
(45) Date of Patent: Jun. 7, 2016

(54) FINFET AND METHOD OF FABRICATION

(71) Applicant: GLOBALFOUNDRIES Inc., Grand Cayman (KY)

(72) Inventors: Thomas N. Adam, Slingerlands, NY (US); Kangguo Cheng, Schenectady, NY (US); Ali Khakifirooz, Los Altos, CA (US); Alexander Reznicek, Troy, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/528,266

(22) Filed: Oct. 30, 2014

(65) Prior Publication Data
US 2015/0056792 A1    Feb. 26, 2015

Related U.S. Application Data

(62) Division of application No. 13/737,067, filed on Jan. 9, 2013, now Pat. No. 8,981,493.

(51) Int. Cl.
*H01L 21/84*  (2006.01)
*H01L 27/12*  (2006.01)
*H01L 21/8234* (2006.01)
*H01L 27/088* (2006.01)
*H01L 21/02*  (2006.01)
(Continued)

(52) U.S. Cl.
CPC ...... *H01L 27/1211* (2013.01); *H01L 21/02609* (2013.01); *H01L 21/02634* (2013.01); *H01L 21/823431* (2013.01); *H01L 21/845* (2013.01); *H01L 27/0886* (2013.01); *H01L 29/7855* (2013.01); *H01L 27/1104* (2013.01)

(58) Field of Classification Search
CPC .......... H01L 21/02; H01L 29/78; H01L 21/84
USPC .......... 257/390, 347, 401, 301, 280
See application file for complete search history.

(56) References Cited

U.S. PATENT DOCUMENTS 6,815,277 B2   11/2004   Fried et al.
6,867,460 B1    3/2005   Anderson et al.
(Continued)

OTHER PUBLICATIONS

V. Hu et al., "FinFET SRAM Cell Optimization Considering Temporal Variability Due to NBTI/PBTI, Surface Orientation and Various Gate Dielectrics," IEEE Transactions on Electron Devices, vol. 58, No. 3, Mar. 2011, pp. 805-811.

(Continued)

*Primary Examiner* — Chuong A Luu
*Assistant Examiner* — Rodolfo Fortich
(74) *Attorney, Agent, or Firm* — Heslin Rothenberg Farley & Mesiti P.C.

(57) ABSTRACT

An improved finFET and method of fabrication is disclosed. Embodiments of the present invention take advantage of the different epitaxial growth rates of {110} and {100} silicon. Fins are formed that have {110} silicon on the fin tops and {100} silicon on the long fin sides (sidewalls). The lateral epitaxial growth rate is faster than the vertical epitaxial growth rate. The resulting merged fins have a reduced merged region in the vertical dimension, which reduces parasitic capacitance. Other fins are formed with {110} silicon on the fin tops and also {110} silicon on the long fin sides. These fins have a slower epitaxial growth rate than the {100} side fins, and remain unmerged in a semiconductor integrated circuit, such as an SRAM circuit.

7 Claims, 6 Drawing Sheets

(51) Int. Cl.
*H01L 29/78* (2006.01)
*H01L 27/11* (2006.01)

(56) References Cited

U.S. PATENT DOCUMENTS

| | | | |
|---|---|---|---|
| 7,566,949 B2 | 7/2009 | Dyer et al. | |
| 7,754,560 B2 | 7/2010 | Burnett et al. | |
| 8,076,236 B2 | 12/2011 | Schultz et al. | |
| 2005/0224890 A1* | 10/2005 | Bernstein et al. | 257/371 |
| 2007/0158730 A1* | 7/2007 | Burnett et al. | 257/314 |
| 2008/0121948 A1 | 5/2008 | Kim et al. | |
| 2012/0199888 A1* | 8/2012 | Dai et al. | 257/288 |

OTHER PUBLICATIONS

V. S. Basker et al., "A 0.063 μm2 FinFET SRAM cell demonstration with conventional lithography using a novel integration scheme with aggressively scaled fin and gate pitch," 2010 Symposium on VLSI Technology (VLSIT), Jun. 15-17, 2010, pp. 19-20.

H. Kawasaki et al., "Challenges and solutions of FinFET integration in an SRAM cell and a logic circuit for 22 nm node and beyond," 2009 IEEE International Electron Devices Meeting (IEDM), Dec. 7-9, 2009, 4 pages.

B. Doris et al., "A Simplified Hybrid Orientation Technology (SHOT) for high performance CMOS," Digest of Technical Papers, 2004 Symposium on VLSI Technology, Jun. 15-17, 2004. pp. 86-87.

* cited by examiner

FINFET AND METHOD OF FABRICATION

CROSS REFERENCE TO RELATED APPLICATIONS

This application is a division of commonly-owned, copending U.S. patent application Ser. No. 13/737,067 entitled FINFET AND METHOD OF FABRICATION and filed on Jan. 9, 2013.

FIELD OF THE INVENTION

The present invention relates generally to semiconductor fabrication, and more particularly, to a fin field effect transistor (FinFET) and method of fabrication.

BACKGROUND OF THE INVENTION

With the continuing trend towards miniaturization of integrated circuits (ICs), there is a need for transistors to have higher drive currents with increasingly smaller dimensions. Fin field effect transistor (FinFET) technology is becoming more prevalent as device size continues to shrink. Devices such as static random access memory (SRAM) devices benefit from smaller dimensions provided by finFETs, which result in increased memory density. A memory device such as an SRAM device comprises "memory cell" transistors which are used to make up the storage circuits of the SRAM device. In addition to memory cell transistors, multiple "logic" transistors are utilized to control various circuitry, such as word lines, bit lines, and other signals. The requirements for the logic transistors may be different than those for the memory cell transistors. It is therefore desirable to have an improved finFET and method of fabrication to accommodate these varying requirements.

SUMMARY OF THE INVENTION

In one embodiment of the present invention, a semiconductor structure is provided. The semiconductor structure comprises a first semiconductor fin disposed on a substrate, wherein the first semiconductor fin comprises a top surface and two sidewall surfaces comprising a {100} crystalline plane, and wherein the first semiconductor fin top surface is comprised of a {110} crystalline plane; and a second semiconductor fin; wherein the second semiconductor fin comprises a top surface and two sidewall surfaces comprising a non-{100} crystalline plane, and wherein the second semiconductor fin top surface is comprised of a {110} crystalline plane.

In another embodiment of the present invention, an integrated circuit is provided. The integrated circuit comprises a semiconductor substrate having a top surface comprised of a {110} crystalline plane, a first group of finFET transistors comprising a first set of fins, the first set of fins having fin sidewalls, the first set of fins oriented on the semiconductor substrate such that its fin sidewalls have a {100} crystalline plane, and a second group of finFET transistors comprising a second set of fins, the second set of fins having fin sidewalls, the second set of fins oriented on the semiconductor substrate perpendicular to the first set of fins, such that the fin sidewalls of the second set of fins have a non-{100} crystalline plane.

In another embodiment of the present invention, a method of fabricating a semiconductor structure is provided. The method comprises forming a first set of fins on a {110} wafer, each fin of the first set of fins having a top surface and two sidewalls, wherein each fin of the first set of fins is oriented with its top oriented parallel to a {110} plane and its sidewalls parallel to a {100} plane, and forming a second set of fins on the {110} wafer, each fin of the second set of fins having two sidewalls, wherein each fin of the second set of fins is oriented with its top oriented parallel to a {110} plane and its sidewalls not oriented to a {100} plane.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
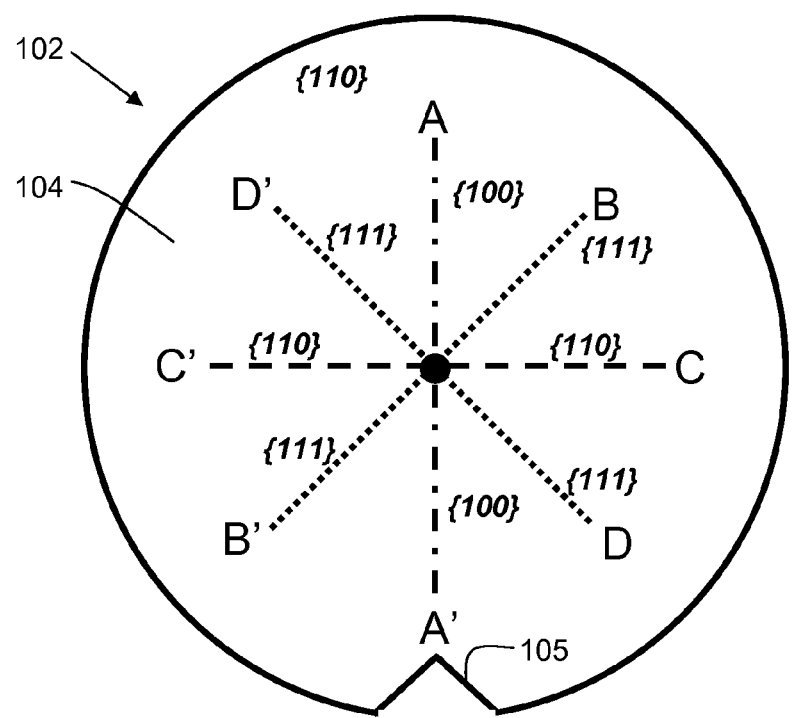

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a top down view of a wafer used in embodiments of the present invention.

Figure 2:
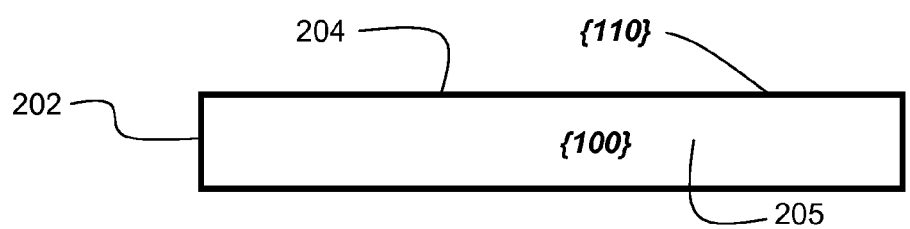

FIG. 2 shows a side view of a substrate used in embodiments of the present invention, as viewed along line A-A' of FIG. 1.

Figure 3:
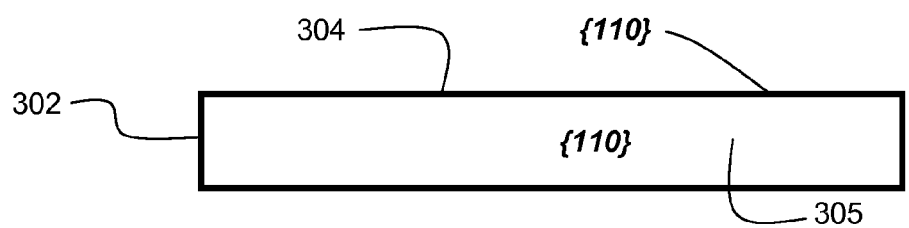

FIG. 3 shows a side view of a substrate used in embodiments of the present invention, as viewed along line C-C' of FIG. 1.

Figure 4:
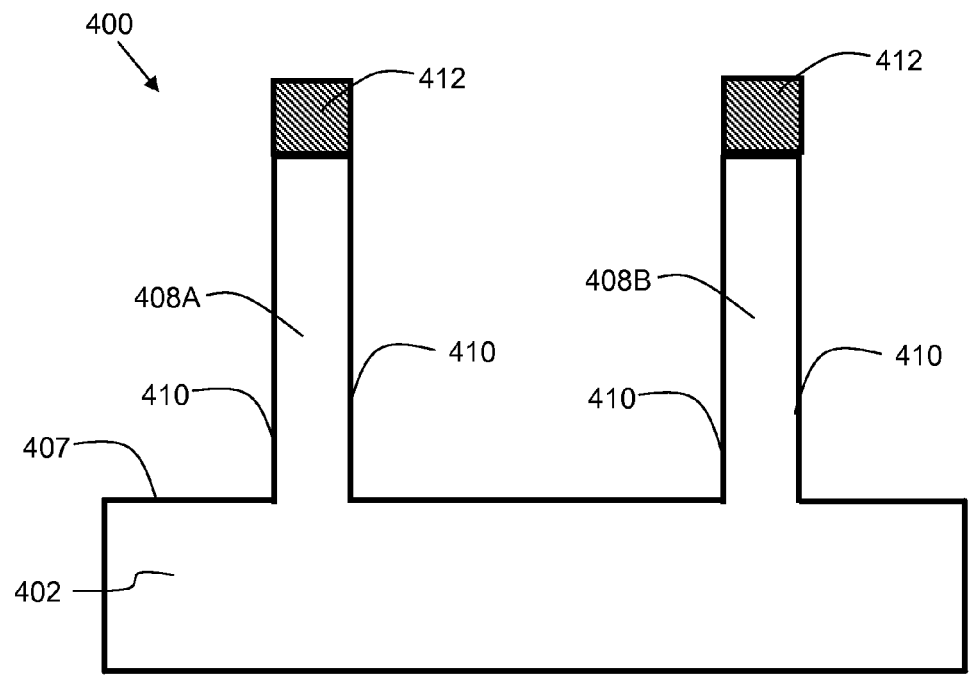

FIG. 4 shows a semiconductor structure in accordance with an embodiment of the present invention.

Figure 5:
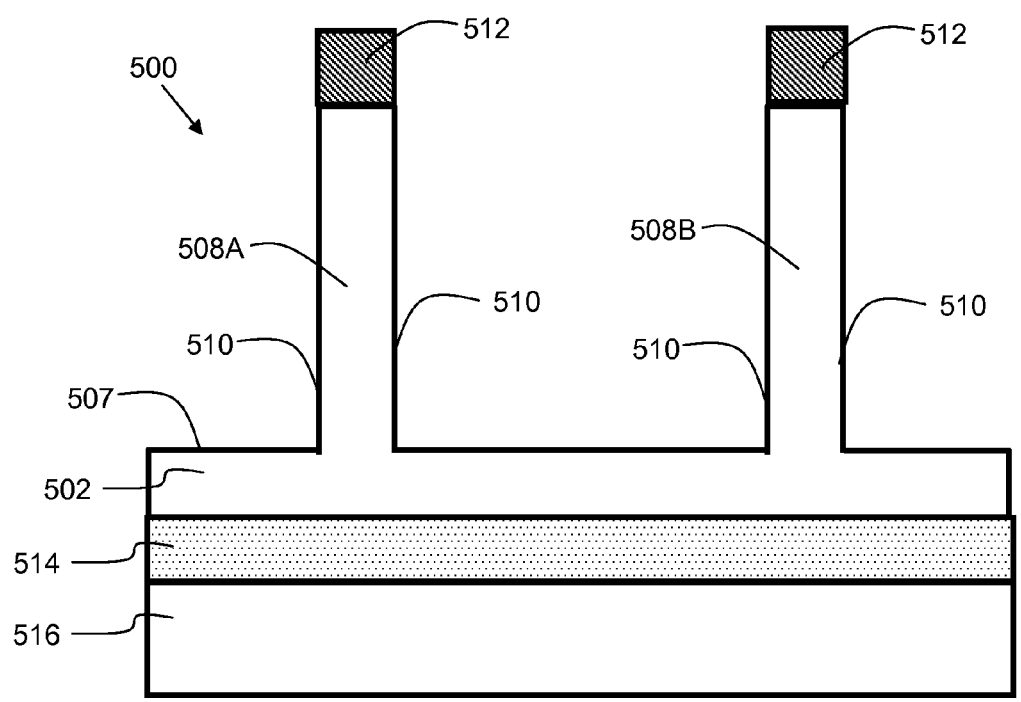

FIG. 5 shows a semiconductor structure in accordance with an alternative embodiment of the present invention.

Figure 6:
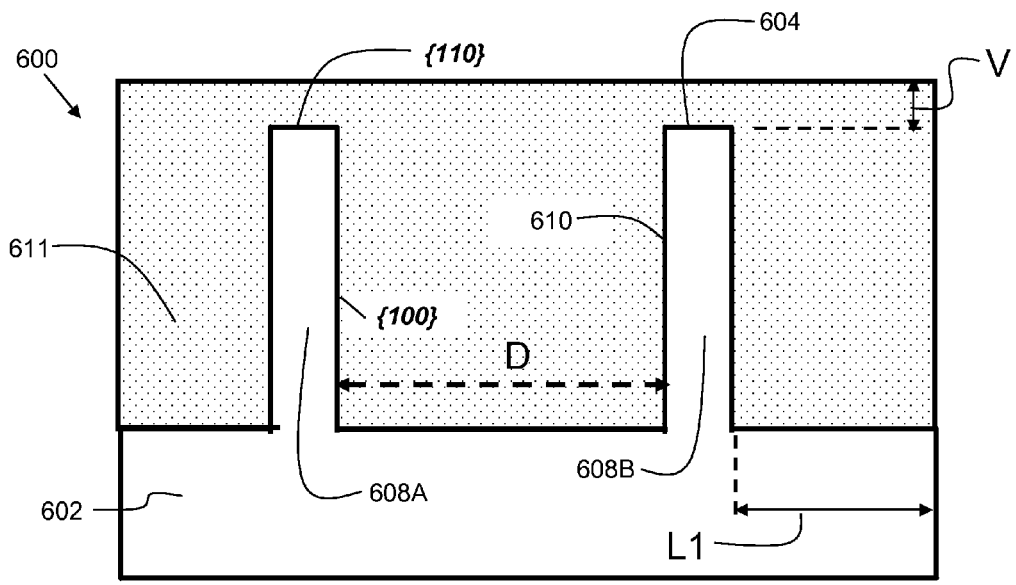

FIG. 6 shows a semiconductor structure in accordance with an embodiment of the present invention after a subsequent process step of forming a fin merging region.

Figure 7:
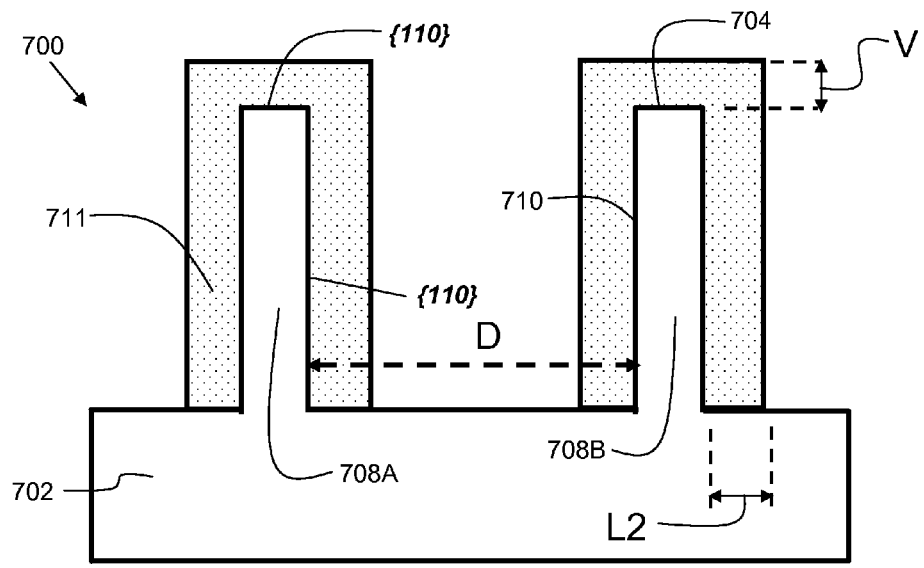

FIG. 7 shows a semiconductor structure in accordance with an alternative embodiment of the present invention after a subsequent process step of forming a fin merging region.

Figure 8:
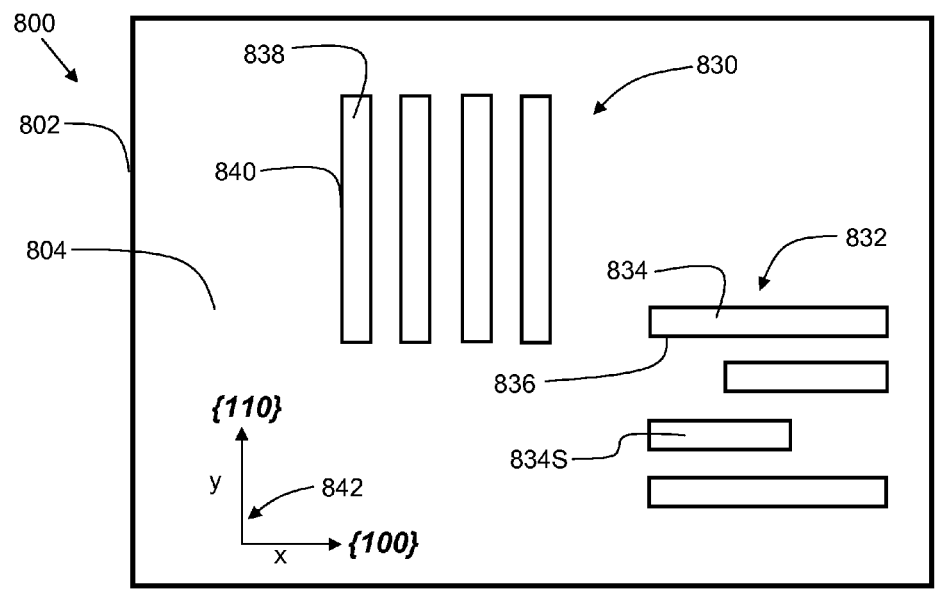

FIG. 8 shows a semiconductor structure in accordance with an embodiment of the present invention.

Figure 9:
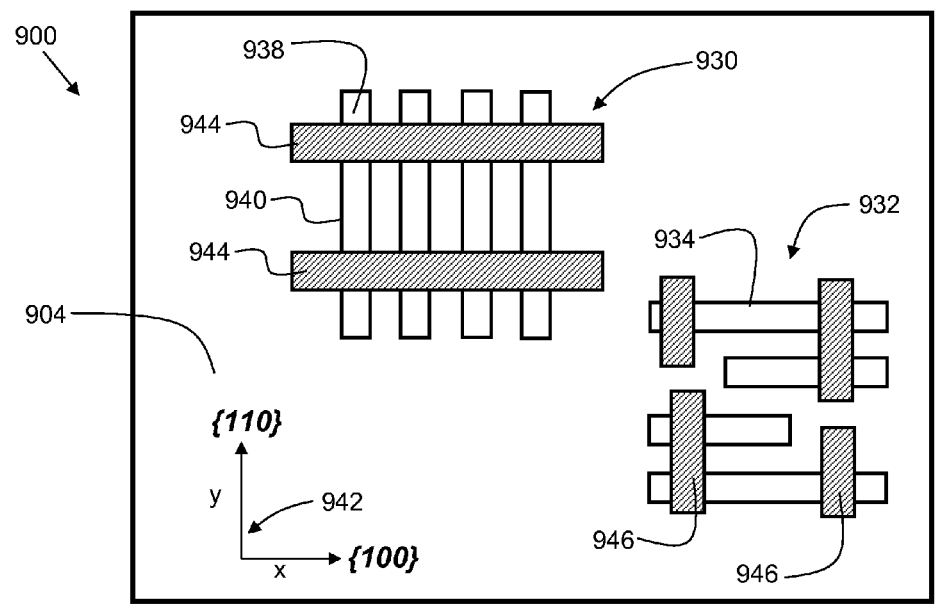

FIG. 9 shows a semiconductor structure in accordance with an embodiment of the present invention after a subsequent process step of gate formation.

Figure 10:
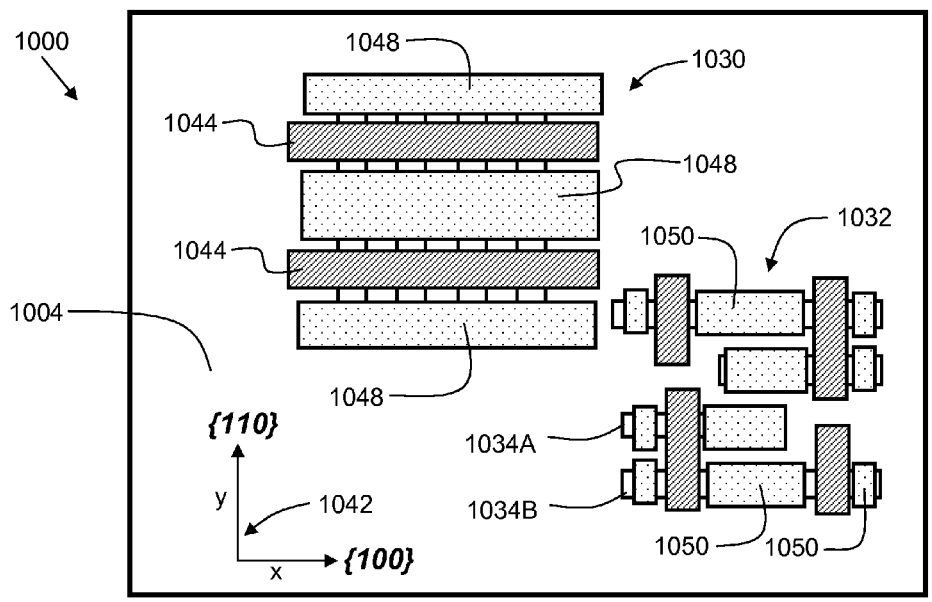

FIG. 10 shows a semiconductor structure in accordance with an embodiment of the present invention after a subsequent process step of forming a fin merging region.

Figure 11:
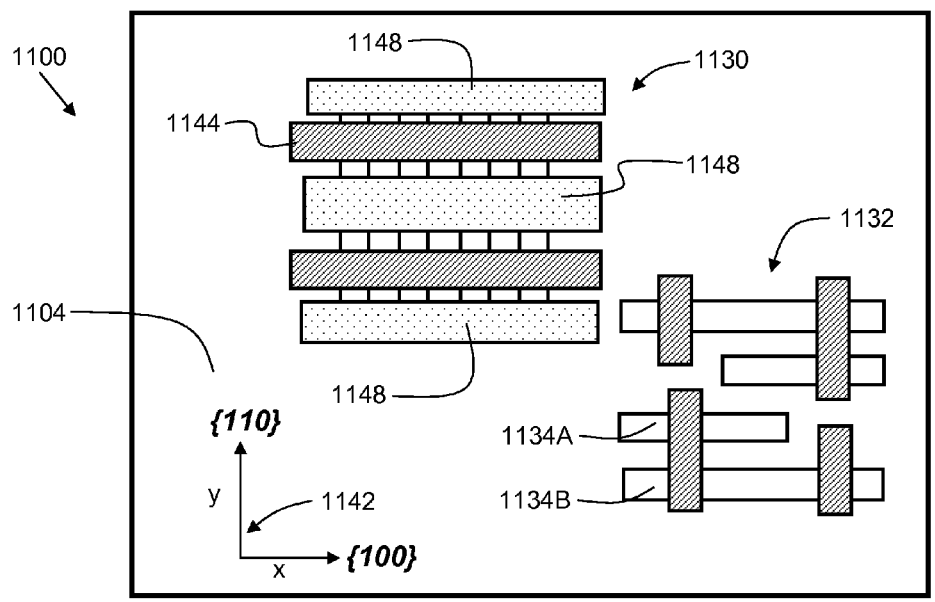

FIG. 11 shows a semiconductor structure in accordance with an embodiment of the present invention after an optional subsequent process step of performing an etch to remove a portion of the fin merging region.

Figure 12:
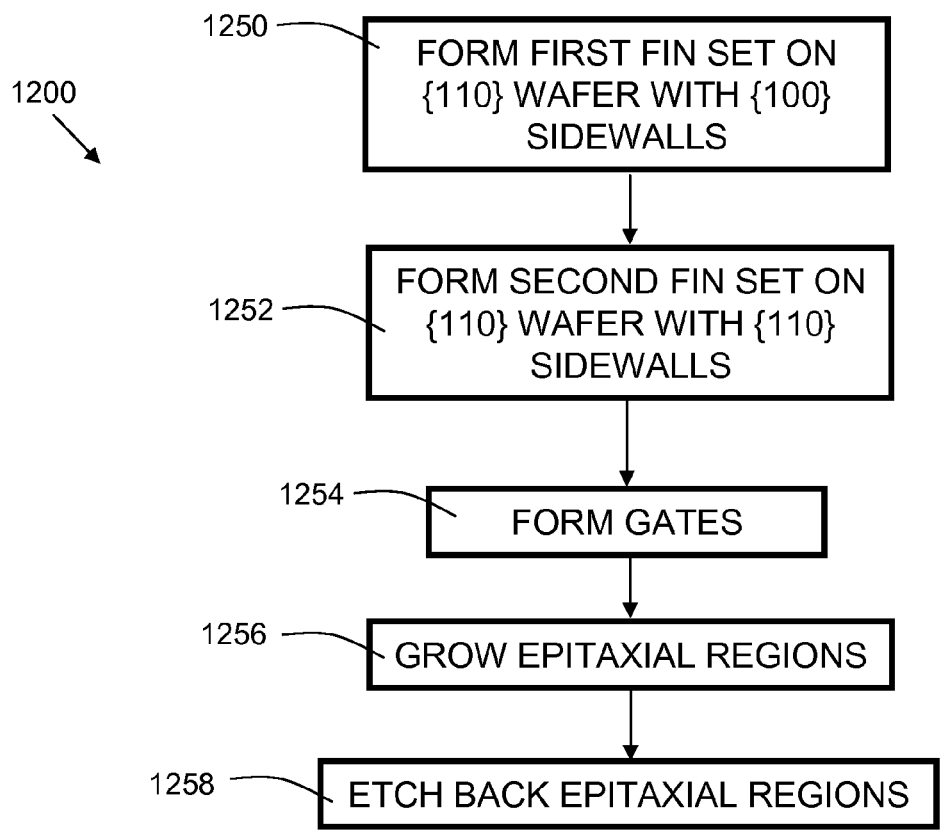

FIG. 12 is a flowchart indicating process steps for embodiments of the present invention.

DETAILED DESCRIPTION

FIG. 1 shows a top down view of a crystalline semiconductor substrate (wafer) 102 used in embodiments of the present invention. Wafer 102 is a so-called "110" wafer, meaning that the top surface 104 has a crystalline plane of {110}, where {110} refers to the Miller index for the top surface. Notch 105 serves as an orienting feature for wafer 102. Line A-A' is aligned with notch 105. When wafer 102 is cut along line A-A' the side surface of the wafer along the cut line has a crystalline plane of {100}. Similarly, when wafer 102 is cut along line C-C', which is perpendicular (orthogonal) to line A-A', the side surface of the wafer along line C-C' has a crystalline plane of {110}. Along lines B-B' and D-D', the side surface of the wafer has a crystalline plane of {111}. Substrate 102 may be comprised of silicon. In other embodiments, substrate 102 is comprised of a material including germanium, silicon germanium, silicon carbide, III-V compound semiconductors, or II-VI compound semiconductors.

FIG. 2 shows a side view of a substrate 202 used in embodiments of the present invention, as viewed along line A-A' of FIG. 1. Top surface 204 has a crystalline plane of {110}, and side surface 205 has a crystalline plane of {100}.

FIG. 3 shows a side view of a substrate 302 used in embodiments of the present invention, as viewed along line C-C' of FIG. 1. As stated previously, similar elements may be referred to by similar numbers in various figures (FIGs) of the drawing, in which case typically the last two significant digits may be the same. For example, substrate 302 of FIG. 3 is similar to substrate 202 of FIG. 2. Top surface 304 has a crystalline plane of {110} similar to substrate 202 of FIG. 2. However, side surface 305 also has a crystalline plane of {110}, as compared with the side surface of substrate 202 of FIG. 2, which has a crystalline plane of {100}.

Epitaxial semiconductors grow at different rates on different crystalline planes.

Epitaxial semiconductors grows faster on the {100} crystalline plane than on a non-{100} crystalline plane, which may include the {110} or {111} crystalline plane. Embodiments of the present invention exploit this growth rate difference to provide two types of finFETs. A "fast merge" finFET has a crystalline plane of {110} on the fin top surface, and a crystalline plane of {100} on the fin side surfaces. This results in a faster lateral growth rate than vertical growth rate. In some embodiments, the lateral growth rate ranges from about 2 nanometers per minute to about 10 nanometers per minute, and the vertical growth rate ranges from about 0.5 nanometers per minute to about 3 nanometers per minute. In some embodiments, the lateral growth rate is greater than 1.5 times the vertical growth rate. In some embodiments, the lateral growth rate ranges from about 1.5 times the vertical growth rate to about 4 times the vertical growth rate.

In integrated circuits such as SRAM arrays, there are both memory cell transistors and logic transistors. Logic transistors typically need to handle higher drive currents than memory cell transistors. In order to handle the higher drive currents, it is often desirable to merge fins. Embodiments of the present invention provide the fast merge finFET which has a faster lateral epitaxial growth rate than the vertical epitaxial growth rate. This is achieved by forming fins with a {110} top surface and a {100} side surface. Since the vertical growth rate is slower, the height of the epitaxial fin merge region is reduced, which reduces the parasitic capacitance of the transistor. Hence the fast merge finFET of embodiments of the present invention provides improved performance in terms of reduced parasitic capacitance.

In contrast, for memory cell transistors, it is desirable to take up as little space as possible. Hence, they are preferably single fin transistors, or "unmerged" transistors. The unmerged transistors may be achieved by forming fins with a {100} top surface and a {110} side surface (in this disclosure, "side surface" refers to the long side of the fin, also referred to as the fin sidewall). Since the side surface of a {110} fin grows an epitaxial semiconductor slower than on the side surface of a {100} fin, a timed epitaxial process can be used to merge the fins with a {100} side surface, while leaving the fins with a {110} side surface as unmerged. Thus, a single epitaxial process can be used to form both logic finFETs and memory cell finFETs, without the need for additional masks and multiple epitaxial processes. In alternative embodiments, the unmerged transistors (slow lateral growth) may be formed with a {111} side surface (by forming fins along lines B-B' or D-D' of 102 in FIG. 1), which also exhibits a slower epitaxial growth rate than that of fin with a {100} side surface.

FIG. 4 shows a semiconductor structure 400 in accordance with an embodiment of the present invention. Substrate 402 may be comprised of a {110} silicon wafer. In other embodiments, substrate 402 may be comprised of a material including germanium, silicon germanium, silicon carbide, III-V compound semiconductors, or II-VI compound semiconductors. Fins 408A and 408B are formed using industry standard processes such as patterning and etching, the sidewall image transfer (SIT) process, or other suitable fin formation process. Fins 408A and 408B are formed such that the fin sides 410 are parallel to line A-A' of the wafer 102 shown in FIG. 1. Top surface 407 has a crystalline plane of {110}. Fin sides 410 have a crystalline plane of {100}. A pad nitride 412 may be formed on the substrate 402 prior to forming the fins, and serves to protect the fins during intermediate processing steps. The pad nitride 412 may be removed prior to fin merging.

FIG. 5 shows a semiconductor structure 500 in accordance with an alternative embodiment of the present invention. Structure 500 is similar to structure 400, except that whereas structure 400 of FIG. 4 is a "bulk" structure where the fins are formed directly on a thick substrate, structure 500 is a semiconductor-on-insulator (SOI) structure, where substrate 502 is thin, and is disposed over insulator layer 514 which is in turn disposed on a thicker substrate 516. Substrate 502 may be comprised of a {110} silicon wafer. In other embodiments, substrate 502 may be comprised of a material including germanium, silicon germanium, silicon carbide, III-V compound semiconductors, or II-VI compound semiconductors. Substrate 516 may also be comprised of silicon. In other embodiments, substrate 516 may be comprised of a material including germanium, silicon germanium, silicon carbide, III-V compound semiconductors, or II-VI compound semiconductors. Insulator layer 514 may be a buried oxide (BOX) layer. Fins 508A and 508B are formed using industry standard processes such as patterning and etching, the sidewall image transfer (SIT) process, or other suitable fin formation process. Fins 508A and 508B are formed such that the fin sides 510 are parallel to line A-A' of the wafer 102 shown in FIG. 1. Top surface 507 has a crystalline plane of {110}. Fin sides 510 have a crystalline plane of {100}. A pad nitride 512 may be formed on the substrate 502 prior to forming the fins, and serves to protect the fins during intermediate processing steps. The pad nitride 512 may be removed prior to fin merging.

FIG. 6 shows a semiconductor structure 600, which is similar to structure 400 of FIG. 4, in accordance with an embodiment of the present invention after a subsequent process step of forming a fin merging region 611. Fin merging region 611 is an epitaxially grown semiconductor region, and may be comprised of epitaxially grown silicon. Since the fin sides 610 have a {100} crystalline plane, and the fin top 604 has a {110} crystalline plane, the epitaxial semiconductor grows faster in the horizontal (lateral) direction than in the vertical direction. D is the distance between two adjacent fins, measured from the fin sides that face each other. The lateral growth distance L1 is greater than D/2, so that fins 608A and 608B are merged during the epitaxial growth process of semiconductor region 611. The lateral growth distance L1 is larger than the amount of vertical growth distance V. This improves transistor performance since the shorter vertical growth reduces parasitic capacitance, while the lateral growth merges the fins to accommodate higher drive currents encountered by logic transistors in an SRAM device.

FIG. 7 shows a semiconductor structure 700 in accordance with an alternative embodiment of the present invention after a subsequent process step of forming a fin merging region. Fins 708A and 708B are formed such that the fin sides 710 are parallel to line C-C' of the wafer 102 shown in FIG. 1. Because epitaxial semiconductor 711 grows slower on a {110} surface than on a {100} surface, fins 708A and 708B are not merged during an epitaxial process that merges structure 600 of FIG. 6. The fins of structure 700 have a lateral growth distance L2, which is less then lateral growth distance L1 for structure 600 of FIG. 6. D is the distance between two adjacent fins, measured from the fin sides that face each other. The lateral growth distance L2 is less than D/2, so that fins 708A and 708B are not merged during the epitaxial growth process of semiconductor region 711. Semiconductor region 711 may be comprised of epitaxially grown silicon.

FIG. 8 shows a semiconductor structure 800 in accordance with an embodiment of the present invention. Structure 800 comprises a substrate 802 having a top surface 804 with a first set of fins 830 and a second set of fins 832 formed thereon. Top surface 804 has a crystalline plane of {110}. First set of fins 830 are formed along the y axis (see legend 842), and each fin 838 of the first set of fins 830 has a fin sidewall 840 facing the x axis. Thus, the fin sidewalls 840 of the first set of fins 830 have a crystalline plane of {100}. Second set of fins 832 are formed along the x-axis (see legend 842), and each fin 834 of the second set of fins 832 has a fin sidewall 836 facing the y axis. Thus, the fin sidewalls 836 of the second set of fins 832 have a crystalline plane of {110}. Therefore, epitaxial growth rate of a semiconductor region on the first set of fins is faster than the epitaxial growth rate of a semiconductor region on the second set of fins. In some embodiments, the growth rate on the sidewalls 840 of the first set of fins ranges from about 0.3 micrometers per minute to about 0.4 micrometers per minute, and the growth rate on the sidewalls 836 of the second set of fins ranges from about 0.01 micrometers per minute to about 0.25 micrometers per minute. In embodiments, the first set of fins 830 and the second set of fins 832 may be formed by a sidewall image transfer (SIT) process. The fins may be cut as necessary to form a desired circuit, as shown in second set of fins 832, where fin 834S is shorter than fin 834.

FIG. 9 shows a semiconductor structure 900 in accordance with an embodiment of the present invention after a subsequent process step of gate formation. Gates 944 are formed on first set of fins 930. Gates 946 are formed on second set of fins 932. Gates 944 and 946 may be comprised of a gate dielectric and a gate conductor. Gate dielectric may comprise silicon oxide, silicon nitride, silicon oxynitride, a high-k material (e.g. hafnium oxide), or any combination of those materials. The gate conductor may comprise doped polysilicon, silicide, metal, conductive metal compound, or any combination of those materials. Gates 944 and 946 may be formed by using any suitable patterning technique such as lithography, or sidewall image transfer (SIT) process. An SIT process is advantageous because once SIT spacers are formed around a rectangular mandrel and a rectangular-shaped gate is formed, cut mask can be applied, resulting in a first group of gates perpendicular to those {100} fins, and a second group of gates perpendicular to those {110} fins. The gate may further comprise a spacer (e.g., nitride, oxide, etc.) on gate sidewalls (not shown).

FIG. 10 shows a semiconductor structure 1000 in accordance with an embodiment of the present invention after a subsequent process step of forming fin merging regions. Fin merging regions are epitaxially grown semiconductor regions and may comprise epitaxially grown silicon. Fin merging regions 1048 merge the fins of first set of fins 1030, which are oriented so that the long sides (sidewalls) of the fins have a {100} crystalline plane, and hence, fast epitaxial growth. Fin merging regions 1050 do not merge the fins of second set of fins 1032, which are oriented so that the long sides of the fins have a {110} crystalline plane, and hence, slower epitaxial growth. Therefore, a single epitaxial process merges some fins (first set 1030) while leaving other fins (second set 1032) unmerged. In some embodiments, the first set of fins 1030 may be part of one or more logic finFETs and the second set of fins 1032 may be part of one or more memory cell finFETs. Semiconductor structure 1000 may comprise an SRAM integrated circuit.

FIG. 11 shows a semiconductor structure 1100 in accordance with an embodiment of the present invention after an optional subsequent process step of performing an etch to remove a portion of the fin merging region. As a result of the etch, the epitaxial semiconductor regions are removed from second set of fins 1132 (compare with 1050 of FIG. 10). Epitaxial semiconductor regions 1148 are reduced in size compared with regions 1048 of FIG. 10, but still remain intact to keep the first set of fins 1130 merged.

FIG. 12 is a flowchart 1200 indicating process steps for embodiments of the present invention. In process step 1250, a first fin set is formed with {100} fin sidewalls (see 830 of FIG. 8). In process step 1252, a second fin set is formed with {110} fin sidewalls (see 832 of FIG. 8). Process steps 1250 and 1252 may be performed simultaneously, or alternatively, process step 1252 may be performed before or after process step 1250. In process step 1254, gates are formed (see 944 and 946 of FIG. 9). In process step 1256, epitaxial semiconductor regions (fin merging regions) are formed (see 1048 and 1050 of FIG. 10). In process step 1258, optionally, an "etchback" is performed to remove the epitaxial region from the unmerged fins (see 1132 of FIG. 11).

As can now be appreciated, embodiments of the present invention provide an improved finFET and method of fabrication. Embodiments of the present invention take advantage of the different epitaxial growth rates of {110} and {100} silicon. Fins are formed that have {110} silicon on the fin tops and {100} silicon on the long fin sides (sidewalls). The lateral epitaxial growth rate is faster than the vertical epitaxial growth rate. The resulting merged fins have a reduced merged region in the vertical dimension, which reduces parasitic capacitance. Other fins are formed with {110} silicon on the fin tops and also {110} silicon on the long fin sides. These fins have a slower epitaxial growth rate than the {100} side fins, and remain unmerged in a semiconductor integrated circuit, such as an SRAM circuit.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a semiconductor structure comprising:
    forming a first set of fins on a {110} wafer, each fin of the first set of fins having a top surface and two sidewalls, wherein each fin of the first set of fins is oriented with its top oriented parallel to a {110} plane and its sidewalls parallel to a {100} plane, and forming a second set of fins on the {110} wafer, each fin of the second set of fins having two sidewalls, wherein each fin of the second set of fins is oriented with its top oriented parallel to a {110} plane and its sidewalls not oriented to a {100} plane;
    merging the first set of fins, while preserving the second set of fins as unmerged fins, wherein the merging comprises forming an epitaxial semiconductor region on the first set of fins and an epitaxial semiconductor region on the second set of fins; and
    wherein forming the epitaxial semiconductor region on the first set of fins comprises growing the epitaxial semiconductor region laterally therefrom at a first growth rate, and forming the epitaxial semiconductor region on the second set of fins comprises growing the epitaxial semiconductor region laterally therefrom at a second growth rate, wherein the first growth rate is faster than the second growth rate.

2. The method of claim 1, wherein forming a second set of fins on the {110} wafer, comprises forming fins with sidewalls parallel to a {110} plane.

3. The method of claim 2, wherein the forming the first set of fins and forming the second set of fins is performed with a sidewall image transfer process.

4. The method of claim 3, further comprising:
    forming a first gate over the first set of fins; and
    forming a second gate over the second set of fins.

5. The method of claim 4, wherein forming the first gate and forming the second gate is performed with a sidewall image transfer process.

6. A method of fabricating a semiconductor structure comprising:
    forming a first set of fins on a {110} wafer, each fin of the first set of fins having a top surface and two sidewalls, wherein each fin of the first set of fins is oriented with the top oriented parallel to a {110} plane and its sidewalls parallel to a {100} plane, and forming a second set of fins on the {110} wafer, each fin of the second set of fins having two sidewalls, wherein each fin of the second set of fins is oriented with its top oriented parallel to a {110} plane and its sidewalls not oriented to a {100} plane;
    wherein forming the second set of fins on the {11} wafer comprises forming fins with sidewalls parallel to a {110} plane;
    merging the first set of fins, and preserving the second set of fins as unmerged fins; and
    wherein merging the first set of fins comprises forming an epitaxial semiconductor region on the first set of fins and the second set of fins; and
    wherein forming the epitaxial semiconductor region on the first set of fins comprises:
        growing the epitaxial semiconductor region laterally at a first growth rate; and
        growing the epitaxial semiconductor region vertically at a second growth rate, wherein the first growth rate is faster than the second growth rate.

7. The method of claim 6, wherein the first growth rate ranges from about 1.5 times the second growth rate to about 4 times the second growth rate.

* * * * *